United States Patent [19]

Kumazawa et al.

[11] Patent Number: 5,156,323
[45] Date of Patent: Oct. 20, 1992

[54] WIRE BONDING METHOD

[75] Inventors: Shinichi Kumazawa; Kuniyuki Takahashi; Nobuto Yamazaki, all of Tokyo, Japan

[73] Assignee: Kabushiki Kaisha Shinkawa, Tokyo, Japan

[21] Appl. No.: 842,260

[22] Filed: Feb. 27, 1992

[30] Foreign Application Priority Data

Feb. 27, 1991 [JP] Japan .................................. 3-53701

[51] Int. Cl.⁵ ............................................. H01L 21/60
[52] U.S. Cl. .................................................... 228/179
[58] Field of Search ...................... 228/110, 179, 4.5

[56] References Cited

U.S. PATENT DOCUMENTS 4,327,860  5/1982  Kirshenboin et al. ............ 228/179
4,445,633  5/1984  Bonham, Jr. ...................... 228/102

FOREIGN PATENT DOCUMENTS 57-87143  5/1982  Japan .
63-42135  2/1988  Japan .

Primary Examiner—Kenneth J. Ramsey
Attorney, Agent, or Firm—Koda and Androlia

[57] ABSTRACT

In a bonding method used in manufacturing semiconductor devices, after a bonding wire is connected to a first bonding point, a capillary is moved straight up and then moved away from a second bonding point, thus making a first reverse action. From there, the capillary is again raised and a second reverse action is performed so that the capillary is moved again in the direction opposite to the second bonding point. The capillary is further raised with feeding out the wire for the length which is enough to make a wire loop, and then the capillary is moved down to the second bonding point where the bonding is performed.

2 Claims, 3 Drawing Sheets

# WIRE BONDING METHOD

BACKGROUND OF THE INVENTION

1. Field of the Invention

The present invention relates to a wire-bonding method for bonding first and second bonding points of a workpiece, and more particularly, to a method of forming wire loops.

2. Prior Art

In wire bonding, the shape of wire loop should be constant during the entire bonding process. In the currently employed method, after the wire is connected to a first bonding point, a capillary is raised and then a reverse action is performed to the capillary. That is, the capillary is moved horizontally by a small amount in a direction opposite to the second bonding point. These movements of the capillary are performed with a clamp which holds the wire opened. The Japanese Patent Application Publication ("Kokai") Nos. 57-87143 and 63-42135 disclose these methods.

However, this prior art has problems. When the bonding surface of the second bonding point (i.e., the upper surface of the lead on the lead frame) is below the bonding surface of the first bonding point (i.e., the upper surface of the die), and the first bonding point is some distance away from the edge of the die, the wire tends to come into contact with the edge of the die. This causes an "edge shorting" unless the wire loop is set high. In other words, it is necessary that the position to which the wire is raised from the first bonding point is high.

SUMMARY OF THE INVENTION

The object of the present invention is to provide a wire bonding method that can prevent the "edge shorting" without increasing the height of the wire loop and can form a wire loop of a long wire length.

The object of the present invention is accomplished by a unique method wherein a wire is first connected to a first bonding point, a capillary is then raised, and a first reverse action is performed in which the capillary is moved in the direction opposite to the second bonding point. After this movement, the capillary is again raised and a second reverse action is performed in which the capillary is again moved in the direction opposite to the second bonding point. The capillary is raised again and the wire is fed out for a length which is long enough to form a wire loop. After this feeding out of the wire, the capillary is moved down to a point above the second bonding point, and the bonding is performed to connect the wire to the second bonding point.

Since reverse actions are performed twice, bending habits are formed at two points on in the wire which is fed out of the capillary. More specifically, a first bending habit causes a bending point to be formed directly above the first bonding point, and a second bending habit causes another bending point to be formed so that the wire extends obliquely downward to the second bonding point. Accordingly, a loop more or less horizontal or inclined slightly upward can be formed on the wire between the first bending habit point (which is above the first bonding point) and the second bending habit point (which orients toward the second bonding point). As a result, bonding can be performed with the height of the wire loop kept low and the contact between the wire and the die is prevented.

BRIEF DESCRIPTION OF THE INVENTION

FIG. 1 shows the moving path of the capillary according to one embodiment of the, present invention;

FIGS. 2(a) through 2(f) show the shape of the wire at various points on the moving path of the capillary;

DETAILED DESCRIPTION OF THE INVENTION

One embodiment of the present invention will be described below with reference to FIGS. 1 and 2.

Figure 1:
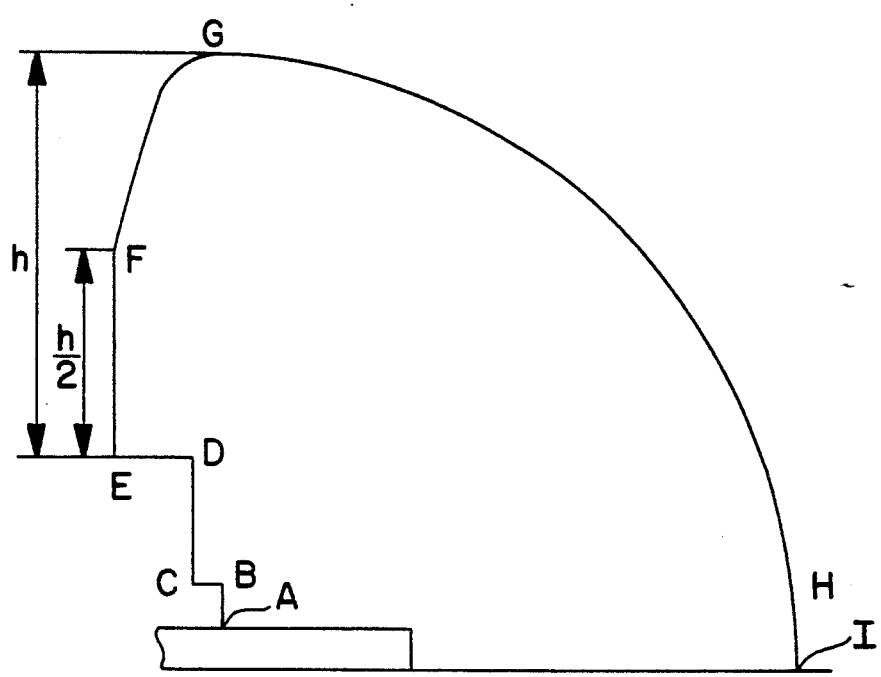

FIG. 1 shows the path which the capillary (used in a bonding machine) makes when it is moved, and FIG. 2 shows the shape of the wire at various points on the moving path of the capillary.

Figure 2A:
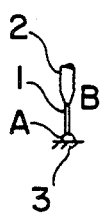
Figures 2B, 2C:
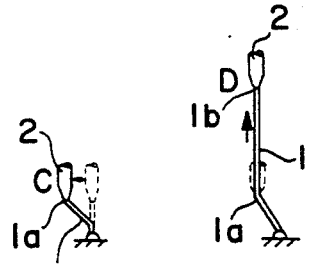

With a clamp which holds the wire 1 open, the capillary 2 is raised slightly to a point B after the wire 1 is connected to the first bonding point A, that is the bonding point on the die 3. The capillary 2 is stopped temporarily or for a moment at this point B, and then a first reverse action is performed. In this reverse action, the capillary 2 is moved horizontally a small amount to point C. In other words, the capillary 2 is moved in the direction opposite to a second bonding point I. As a result of this reverse action, the wire 1 is inclined from point A to point C, and a bending habit is formed at 1a where a portion of the wire is located at the lower end of the capillary 2. This is shown in FIG. 2(b).

Figure 2D:
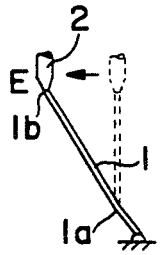
Figure 2E:
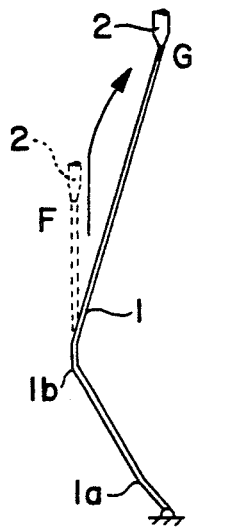

After being stopped temporarily or for a moment at point C, the capillary 2 is raised straight up to point D. Then, a second reverse action is performed there. In other words, the capillary 2 is moved horizontally to point E, that is, the capillary 2 is further moved in the direction opposite to the second bonding point I. As a result of this second reverse action, the wire 1 is inclined from point A to point E, and another bending habit is formed at 1b on the wire where a portion of the wire 1 is located at the lower end of the capillary 2. This is shown in FIG. 2(d).

After being stopped temporarily or for a moment at point E, the capillary 2 is raised to point F. Point F is located at a height of h/2 ("h" will be explained later) above point E. During this movement of the capillary, the wire 1 is fed out, and then the capillary 2 is raised an amount that corresponds to the remaining half of the "h" (h/2) and is moved to point G which is located above the first bonding point A. At point G, the clamp is closed. Once the clamp is closed, the wire 1 is no longer fed out, even if the capillary 2 is moved. In other words, the length of wire 1 fed out from the capillary 2 while the capillary 2 is moved to point G is the length of wire required for the formation of a wire loop. In this state, the wire 1 is shaped as shown by the solid lines in FIG. 2(e).

The capillary 2 is further moved to point H, which is located above the second bonding point I along an elliptical path centered at point B. This elliptical path includes a line between point B and point G forming a minor radius of ellipse and a line between point B and point H (the point H being above the second bonding point I) forming a major radius of ellipse.

The capillary 2 is further lowered to the second bonding point I, and bonding is performed. This final movement is illustrated in FIG. 2(f).

Figure 2F:
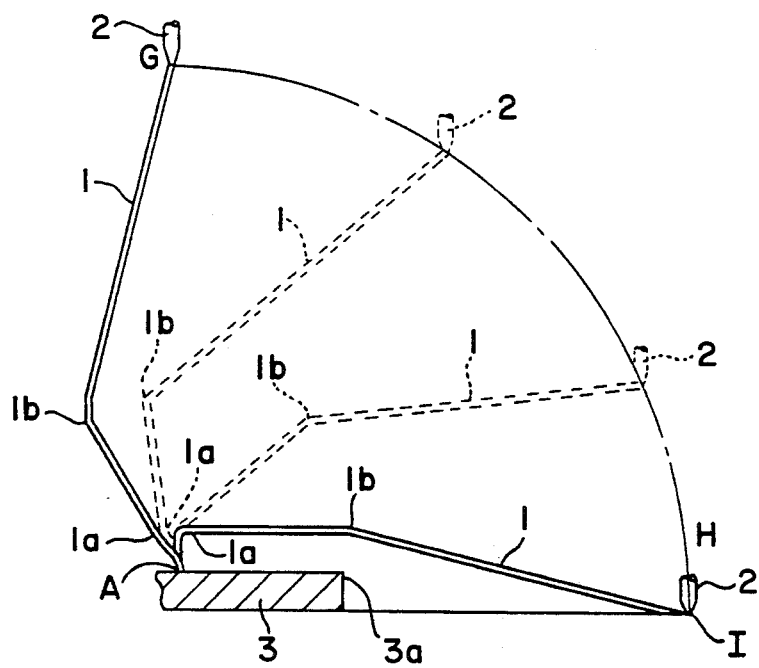

As seen from the moving path of the capillary 2 shown in FIG. 2(f), the bending habit 1a in the wire 1 becomes a bending point which is directly above the first bonding point A, and the bending habit 1b becomes a bending point where the downward incline toward the second bonding point 2 starts. Accordingly, by setting the distance between the bending habits 1a and 1b in accordance with a workpiece to be bonded, a contact between the wire 1 and the die 3 during the bonding process can be prevented with the height of the wire loop kept low even in a case where the first bonding point A is located some distance away from the edge 3a of the die 3. In addition, the height of the rise of the wire loop and the shape of the wire loop can easily be controlled by adjusting as desired the position of the bending habit 1a.

The amount of movement of the capillary shown in FIGS. 1 and 2 will be described below with reference to FIGS. 3 and 4.

Figure 3:
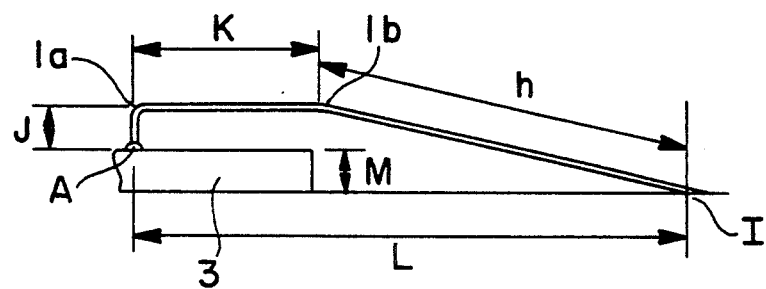
FIG. 3 shows a wire loop shaped by the method of the present invention.
Figure 4:
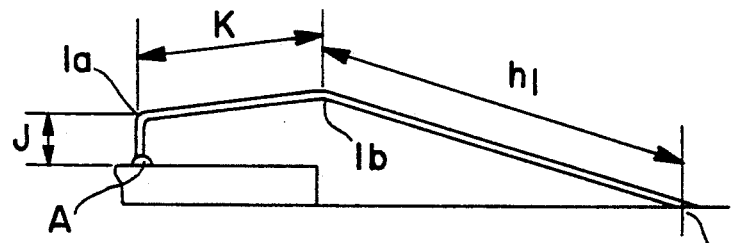
FIG. 4 shows another wire loop shaped by the method of the present invention.

If the length J of the rise or the vertical movement of the wire loop from the first bonding point A is perpendicular to the surface of the first bonding point A, if the length K of the portion of the wire loop between the first bending habit 1a and second bending habit 1b is horizontal, and if the shape of the wire loop is roughly trapezoidal as shown in FIG. 3, then 1. The length J of the wire loop corresponds to the distance between point A and point C in FIG. 1 and can be shown by Formula 1 below, and 2. The length K of the upper side of the wire loop corresponds to the distance between point C and point E in FIG. 1 and can be shown by Formula 2 below.

3. Also, the length L of the lower side of the wire loop corresponds to the horizontal distance between point A and point I in FIGS. 1 and 3, and the height difference M of the workpiece corresponds to the vertical distance between point A and point I in FIGS. 1 and 3. As a result, the "h" described above is obtained from Formula 3 below.

$$J = \sqrt{AB^2 + BC^2} \quad \text{Formula 1}$$

$$K = \sqrt{CD^2 + DE^2} \quad \text{Formula 2}$$

$$h = \sqrt{(L - K)^2 + (J + M)^2} \quad \text{Formula 3}$$

The Formula 3 is for a case where the portion of the wire loop between the first bending habit 1a and a second bending habit 1b is a horizontal orientation as shown in FIG. 3. Accordingly, if "h" is set at "h1", which is larger than the value produced by Formula 3, a wire loop has a portion inclined upward as shown in FIG. 4 between the bending habits 1a and 1b. In other words, the height of the second bending habit 1b can be changed by altering "h1".

The movement of the capillary 2 from point E to point I is not limited to such movement as described above and may instead be similar to the movement disclosed in the prior art.

According to the present invention, the wire is first connected to the first bonding point, the capillary holding the wire is raised, a first reverse action is performed so that the capillary is moved in the opposite direction from the second bonding point, the capillary is again raised, a second reverse action is made so that the capillary is further moved in the direction opposite to the second bonding point, the capillary is again raised with the wire being then fed out to form a loop, and finally the capillary is moved to a point above the second bonding point so that bonding is performed there. Accordingly, the "edge shorting" is prevented even though the wire loop is low in height. In addition, long wire loops can be formed.

We claim:

1. A wire bonding method connecting a first bonding point and a second bonding point wherein: a wire is first connected to said first bonding point, a capillary holding said wire is raised and a first reverse action is performed in which said capillary is moved in the opposite direction from said second bonding point, said capillary is again raised and a second reverse action is performed in which said capillary is moved in the opposite direction from said second bonding point, said capillary is then raised again with such an amount of wire fed out as is necessary for forming a wire loop, said capillary is then moved to a point above said second bonding point, and said wire is connected to said second bonding point.

2. A wire bonding method connecting a wire fed out of a capillary to a first bonding point and then to a second bonding point of a workpiece, said method comprising the steps of:

connecting said wire to said first bonding point;
raising said capillary and then making a first reverse action in which said capillary is moved in a direction opposite to said second bonding point;
raising said capillary and then making a second reverse action in which said capillary is further moved in a direction opposite to said second bonding point;
raising said capillary again and feeding out said wire for an amount necessary for forming a wire loop;
moving said capillary to a point above said second bonding point; and
bonding said wire to said second bonding point.

* * * * *